United States Patent [19]
Kim

[11] Patent Number: 6,128,227
[45] Date of Patent: Oct. 3, 2000

[54] SENSE AMPLIFIER CIRCUIT IN A FLASH MEMORY DEVICE

[75] Inventor: Seung Durk Kim, Sungnam-Shi, Rep. of Korea

[73] Assignee: Hyundai Electronics Industries Co., Ltd., Ichon-Shi, Rep. of Korea

[21] Appl. No.: 09/275,800

[22] Filed: Mar. 25, 1999

[30] Foreign Application Priority Data

Mar. 28, 1998 [KR] Rep. of Korea ...................... 98-10864

[51] Int. Cl.[7] .................................................. G11C 16/06
[52] U.S. Cl. .............................. 365/185.21; 365/185.2; 365/185.33
[58] Field of Search ........................... 365/185.2, 185.21, 365/185.33

[56] References Cited

U.S. PATENT DOCUMENTS

| | | | |
|---|---|---|---|
| 4,639,895 | 1/1987 | Iwahashi et al. | 365/200 |
| 5,168,466 | 12/1992 | Kuo et al. | |
| 5,276,644 | 1/1994 | Pascucci et al. | 365/189.01 |
| 5,528,543 | 6/1996 | Stiegler | 365/207 |
| 5,615,154 | 3/1997 | Yamada. | |
| 5,642,310 | 6/1997 | Song. | |
| 5,675,537 | 10/1997 | Bill et al. | |
| 5,684,739 | 11/1997 | Takeuchi. | |
| 5,717,640 | 2/1998 | Hashimoto | 365/189.07 |

FOREIGN PATENT DOCUMENTS

| | | |
|---|---|---|
| 07192480 | 12/1993 | Japan. |
| 07235190 | 2/1994 | Japan. |
| 08077784 | 8/1994 | Japan. |
| 10149692 | 11/1996 | Japan. |

*Primary Examiner*—David Nelms
*Assistant Examiner*—Gene N. Auduong
*Attorney, Agent, or Firm*—Pennie & Edmonds LLP

[57] ABSTRACT

The present invention discloses a sense amplifier circuit for reading-out information stored in a memory cell, include in a flash memory device having a main cell array in which a plurality of memory cells are connected between a plurality of word lines and a plurality of bit lines comprises an auxiliary cell array in which a plurality of memory cells are connected between a plurality of word lines and a bit line, a reference cell connected between a source voltage and the ground and in which a drain thereof is connected to a common source line of the auxiliary cell array, and a sense amplifier the input terminals of which are connected to the common source line of the auxiliary cell array and the bit line of the main cell array, respectively.

4 Claims, 3 Drawing Sheets

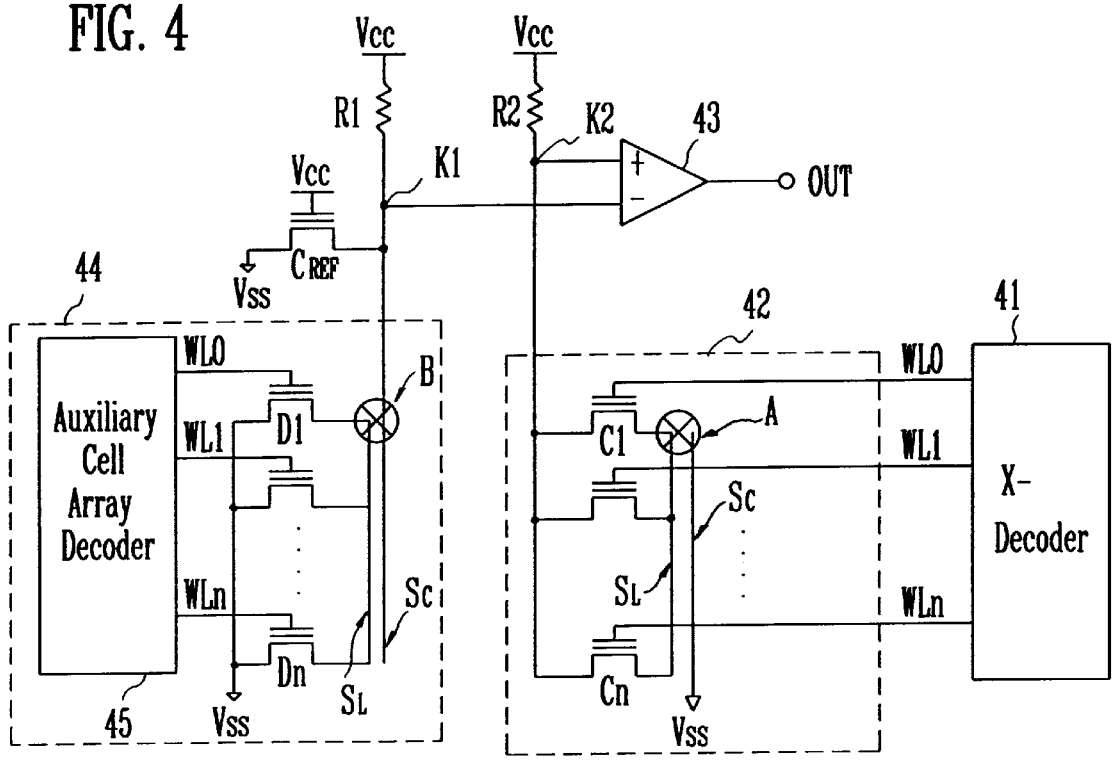
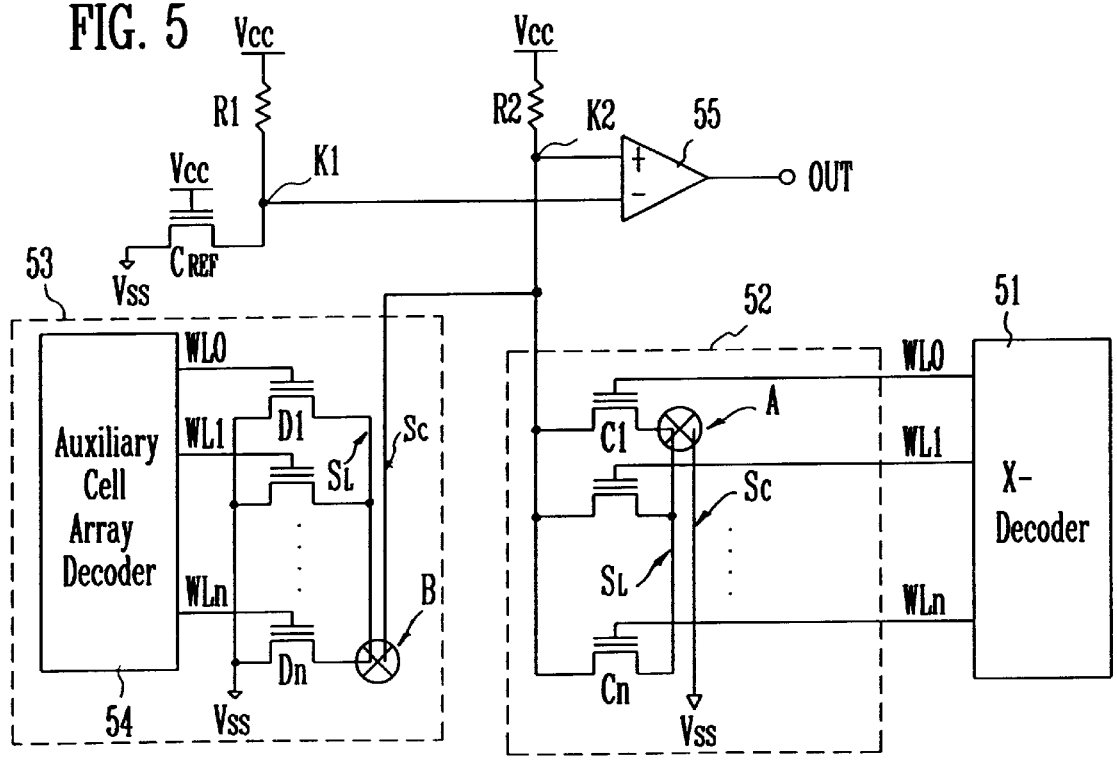

SENSE AMPLIFIER CIRCUIT IN A FLASH MEMORY DEVICE

BACKGROUND OF THE INVENTION

1. Field of the Invention

The present invention relates to a sense amplifier circuit in a flash memory device and, in particular, to a sense amplifier circuit in a flash memory device to which an auxiliary cell array is connected to an input terminal of the sense amplifier to prevent a variation in a cell current according to a change of the position of source contact at the time of read-out operation.

2. Information Disclosure Statement

In general, a flash memory device performs a program operation, an erasure operation and a read-out operation. Data stored in a memory cell by a program operation is output by a read-out operation. The read-out operation is a process of comparing amounts of currents flowing through a reference cell and a memory cell by using a sense amplifier after making currents flow through the reference cell and a selected memory cell and outputting data output from the sense amplifier to a data output buffer. At this time, in case the amount of current flowing through the reference cell is larger than that flowing through the selected memory cell, it is decided that data of "1" is stored in the selected memory cell, and in case the amount of current flowing through the reference cell is smaller than that flowing through the selected memory cell, it is decided that data of "0" is stored in the selected memory cell. The sense amplifier circuit of a flash memory device used in read-out operation will be described below with reference to FIGS. 1 to 3.

FIG. 1 is a circuit diagram to illustrate the sense amplifier circuit of conventional flash memory device and FIG. 2 is a circuit diagram to illustrate a memory cell array of a flash memory device.

A load resistor R1 is connected between a source voltage Vcc and a node K1, and a reference cell $C_{REF}$ to which the source voltage Vcc is supplied through a control gate thereof is connected between the node K1 and the ground Vss. A load resistor R2 is connected between the source voltage Vcc and a node K2, and the node K2 is connected to a bit line of a main memory cell array 11. In addition, the nodes K1 and K2 are connected to a negative(−) input terminal and a positive(+) input terminal of a sense amplifier 12, respectively, and data is output through an output terminal OUT of the sense amplifier 12.

The main memory cell array 11 is constructed in such a way that a plurality of memory cells C1 to Cn are connected between a plurality of word lines WL0 to WLn and a plurality of bit lines BL0 to BLn, respectively, as shown in FIG. 2, wherein a source of each memory cell is composed of a junction to which impurity ions are implanted, that is, a local source line SL. At this time, since the local source line SL is formed of the junction into which the impurity ions are implanted, a resistance value of the local source line SL is large. Therefore, to reduce the resistance value, the local source line SL is connected to a common source line Sc composed of metal. The local source line SL is connected to the common source line Sc through a contact hole A formed at a constant spacing.

At the time of read-out operation, when one memory cell among the main memory cell array 11 is selected and the sense amplifier circuit is enabled, the source voltage Vcc is supplied to the sense amplifier circuit. Accordingly, a current path is formed through the load resistor R1 and reference cell $C_{REF}$. Taking the amount of current flowing through the reference cell $C_{REF}$, the voltage $V_1$ applied to the node K1 becomes Vcc−$I_1$×R. At the same time, other current path is formed through the load resistor R2 and the selected memory cell of the main memory cell array 11, and at this time, a flow of current $I_2$ through the load resistor $R_2$ is generated and the voltage $V_2$ is applied to the node K2. Then the sense amplifier 12 compares the voltage $V_1$ of the node K1 according to the amount of current $I_1$ flowing through the reference cell $C_{REF}$ and the volgate $V_2$ of the node K2 according to the amount of current $I_2$ flowing through the selected memory cell of the main memory cell array 11, and decides that data of "1" is stored, that is, the selected memory cell is a programmed cell, in case the voltage $V_1$ is higher than the voltage $V_2$, and that data of "0" is stored, that is, the selected memory cell is an erased cell, in case the voltage $V_1$ is lower than the voltage $V_2$, and accordingly outputs data through the output terminal OUT.

Since each source of the memory cell of the main memory cell array 11 is connected to the common source line Sc through the contact hole A, the distance from each source to the common source line Sc varies for each source and the resistance value of the common source line Sc varies at the time of read-out operation according to the position of each memory cell. That is, since the amount of current $I_2$ varies according to the position of the selected memory cell, a uniform read-out operation is not performed.

For example, the resistance value of the common source line Sc in case the memory cell C1 positioned near to the contact hole A is selected is smaller than that in case the memory cell Cn positioned far from the contact hole A is selected, and the difference in the amount of current due to the difference in the resistance value is shown in FIG. 3. The curve Ic1 shown in FIG. 3 presents the amount of current flowing through the memory cell when the memory cell positioned far from the contact hole A is selected, and the curve Icn shown in FIG. 3 presents the amount of current flowing through the memory cell when the memory cell positioned near to the contact hole A is selected.

As can be seen from FIG. 3, since the current flowing through the memory cell, that is, the cell current varies according to the position of memory cell selected at the time of read-out operation, in case of using the conventional sense amplifier circuit, the precise readout of data stored in the memory cell is difficult and accordingly the reliability of the device is degraded.

SUMMARY OF THE INVENTION

Therefore, the object of the present invention is to provide a sense amplifier circuit of a flash memory device which can solve the above described disadvantages by connecting an auxiliary cell array to the input terminal of the sense amplifier.

A sense amplifier circuit according to the present invention is included in a flash memory device having a main cell array in which a plurality of memory cells are connected between a plurality of word lines and a plurality of bit lines comprises an auxiliary cell array in which a plurality of memory cells are connected between a plurality of word lines and a bit line, a reference cell connected between a source voltage and ground and in which a drain thereof is connected to a common source line of the auxiliary cell array, and a sense amplifier the input terminals of which are connected to the common source line of the auxiliary cell array and the bit line of the main cell array, respectively.

Another sense amplifier circuit according to the present invention is included in a flash memory device having a main cell array in which a plurality of memory cells are connected between a plurality of word lines and a plurality of bit lines comprises an auxiliary cell array in which a plurality of memory cells are connected between a plurality of word lines and a bit line, a reference cell connected between a source voltage and the ground, and a sense amplifier one input terminal of which is connected to a common source line of the auxiliary cell array and the bit line of the main cell array and the other input terminal of which is connected to a drain of the reference cell.

BRIEF DESCRIPTION OF THE DRAWINGS

The above object and other advantages of the present invention will become more apparent by describing in detail the preferred embodiment of the present invention with reference to the attached drawings in which:

FIG. 4 is a circuit diagram of a first embodiment of the present invention; and

FIG. 5 is a circuit diagram of a second embodiment of the present invention.

Similar reference characters refer to similar parts in the several views of the drawings.

DETAILED DESCRIPTION OF THE INVENTION

Figure 1:
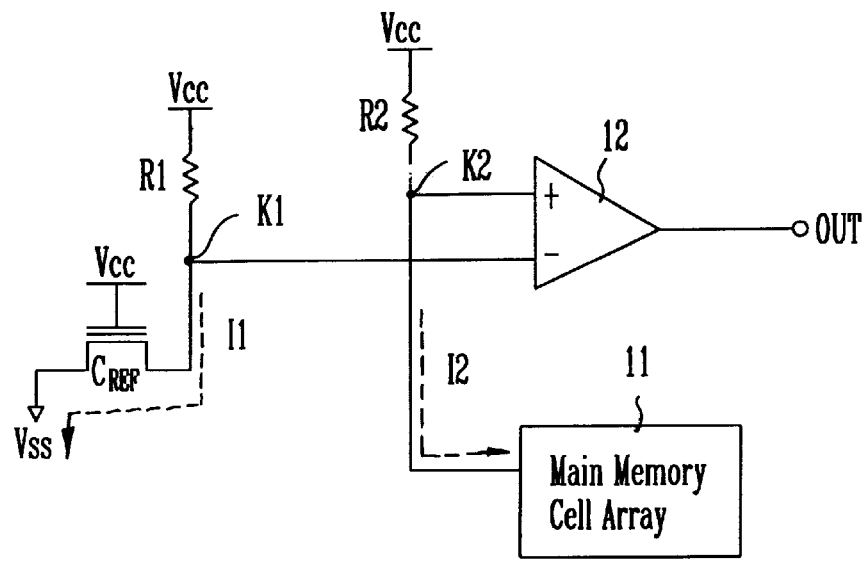
FIG. 1 is a circuit diagram to illustrate a sense amplifier circuit of conventional flash memory device.
Figure 3:
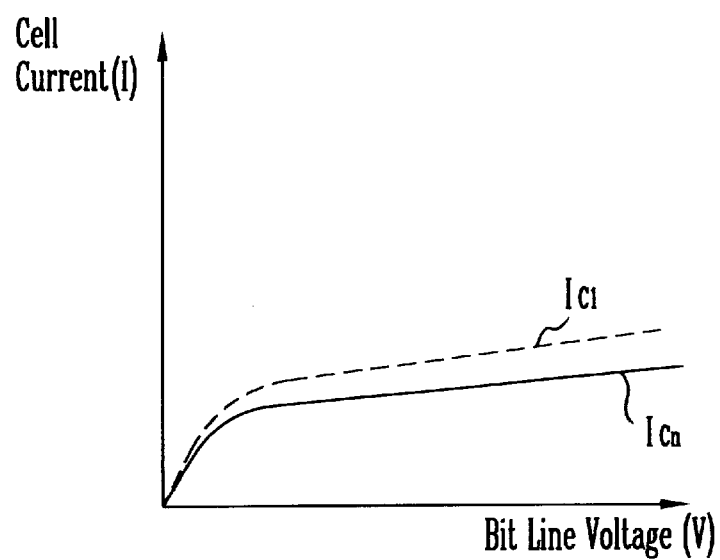
FIG. 3 is a graph showing a variation in cell current according to a change of the position of source contact.
Figure 2:
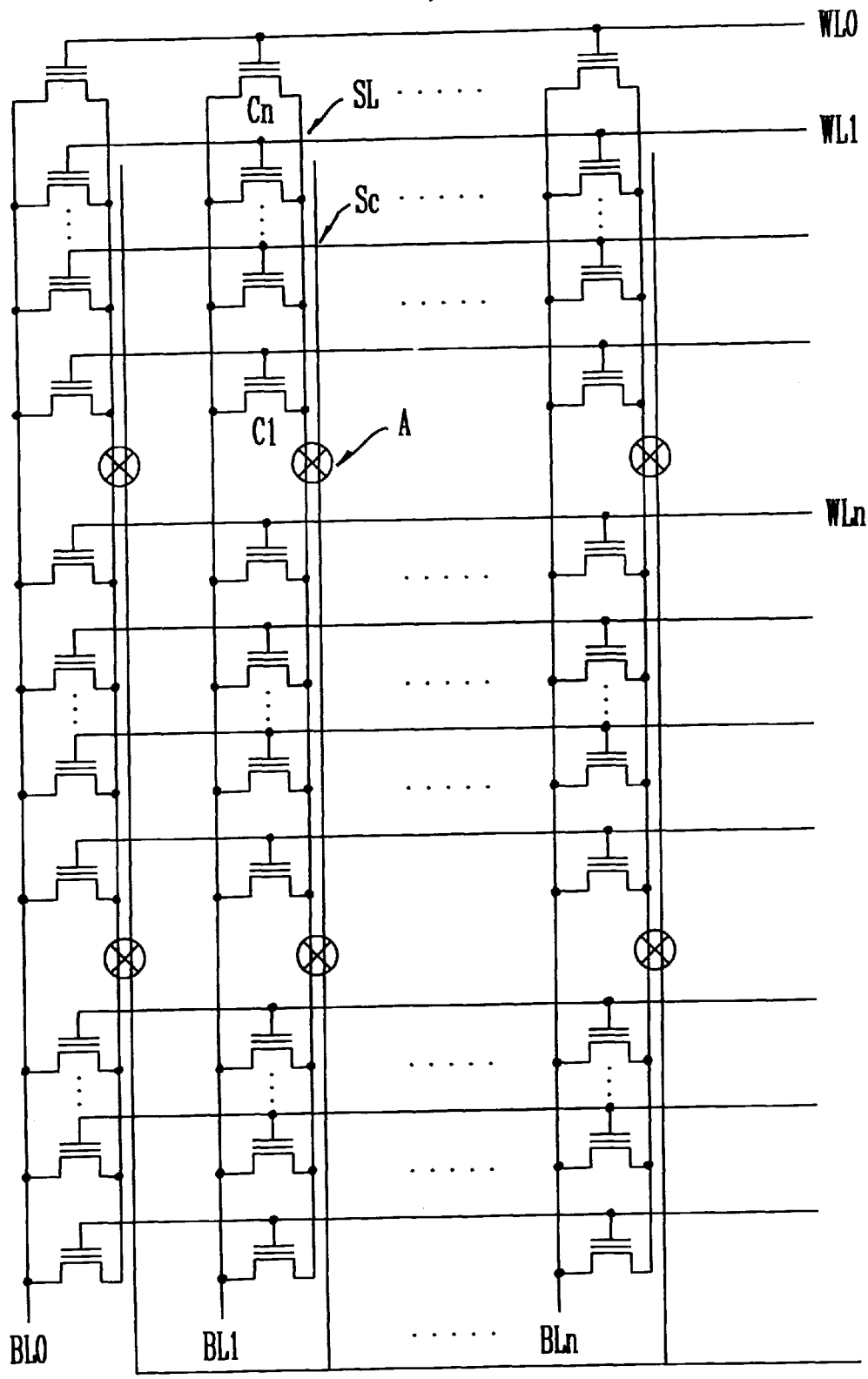
FIG. 2 is a circuit diagram to illustrate a memory cell array of conventional flash memory device.

FIG. 4 is a circuit diagram to illustrate a first embodiment of the present invention.

A load resistor R1 is connected to a source voltage Vcc and node K1, and a reference cell $C_{REF}$ to which the source voltage Vcc is supplied through a control gate thereof is connected between the node K1 and the ground Vss. A common source line Sc of an auxiliary cell array 44 is connected to the node K1. A load resistor R2 is connected between the source voltage Vcc and a node K2, and the node K2 is connected to a bit line of a main cell array 42. In addition, the nodes K1 and K2 are connected to a negative (−) input terminal and a positive(+) input terminal of a sense amplifier 43, respectively, and data is output through an output terminal OUT of the sense amplifier 43.

The auxiliary cell array 44 is constructed in such a way that a plurality of memory cells D1 to Dn are connected between a plurality of word lines WL0 to WLn and a bit line, respectively, and the common source line Sc is connected to sources, that is, a local source line SL of the memory cell D1 to Dn through a contact hole B formed at a constant spacing.

The main memory cell array 42 is constructed in such a way that a plurality of memory cells C1 to Cn are connected between a plurality of word lines WL0 to WLn and a plurality of bit lines, respectively, and a source, that is, a local source line SL of each memory cell C1 to Cn is connected to a common source line Sc through a contact hole A formed at a constant spacing.

Each word line WL0 to WLn of the auxiliary cell array 44 is selected by an output signal of an auxiliary cell array decoder 45, and each word line WL0 to WLn of the main cell array 42 is selected by an output signal of a X-decoder 41.

At the time of read-out operation, if one of the memory cells C1 to Cn of the main cell array 42 is selected by the output signals of the x-decoder 41 and a Y-decoder(not shown) and one of the memory cells D1 to Dn of the auxiliary cell array 44 is selected by the output signals of the auxiliary cell array decoder 45, the sense amplifier circuit is enabled. Then the source voltage Vcc is supplied to the sense amplifier circuit so that a current path through the load resistor R1 and the reference cell $C_{REF}$ is formed, and at this time, the amount of current flowing through the node K1 varies with the position of the selected memory cell of the auxiliary cell array 44.

For example, if it is assumed that the memory cell C1 is selected from the main cell array 42, the memory cell D1 of the auxiliary cell array 44 is selected. That is, since the selected memory cell C1 of the main cell array 42 is positioned near to the contact hole A, the memory cell D1 positioned near to the contact hole B is selected from the auxiliary cell array 44.

In addition, if it is assumed that the memory cell Cn is selected from the main cell array 42, the memory cell Dn of the auxiliary cell array 44 is selected. That is, since the selected memory cell Cn of the main cell array 42 is positioned far from the contact hole A, the memory cell Dn positioned far from the contact hole B is selected from the auxiliary cell array 44.

Therefore, regardless of the position of contact hole A and regardless of which memory cell is selected, the resistance value of the common source line Sc of the main cell array 42 and the resistance value of the common source line Sc of the auxiliary cell array 44 are maintained constantly. Therefore, the ratio of currents flowing through the nodes K1 and K2 depends only on the condition of the reference cell $C_{REF}$ and the selected memory cell regardless of the resistance value of the common source line Sc.

That is, the sense amplifier 43 compares the voltage $V_1$ applied according to the amount of current flowing through the reference cell $C_{REF}$ and the voltage $V_2$ applied according to the amount of current flowing through the selected memory cell, and decides that data of "1" is stored, that is, the selected memory cell is a programmed cell, in case the voltage $V_1$ is higher than the voltage $V_2$, and that data of "0" is stored, that is, the selected memory cell is an erased cell, in case the voltage $V_1$ is lower than the voltage $V_2$, and accordingly outputs data through the output terminal OUT.

FIG. 5 is a circuit diagram to illustrate a second embodiment of the present invention.

A load resistor R1 is connected to a source voltage Vcc and a node K1, and a reference cell $C_{REF}$ to which the source voltage Vcc is supplied through a control gate thereof is connected between the node K1 and the ground Vss. A load resister R2 is connected between the source voltage Vcc and a node K2, and the node K2 is connected to a bit line of a main cell array 52 and to a common source line Sc of an auxiliary cell array 53. In addition, the nodes K1 and K2 are connected to a negative(−) input terminal and a positive(+) input terminal of a sense amplifier 55, respectively, and data is output through an output terminal OUT of the sense amplifier 55.

The auxiliary cell array 53 is constructed in such a way that a plurality of memory cells D1 to Dn are connected between a plurality of word lines WL0 to WLn and a bit line, respectively, and the common source line Sc is connected to sources, that is, a local source line SL of the memory cell D1 to Dn through a contact hole B formed at a constant spacing.

The main memory cell array 52 is constructed in such a way that a plurality of memory cells C1 to Cn are connected between a plurality of word lines WL0 to WLn and a plurality of bit lines, respectively, and a source, that is, a local source line SL of each memory cell C1 to Cn is connected to a common source line Sc through a contact hole A formed at a constant spacing.

Each word line WL0 to WLn of the auxiliary cell array 53 is selected by an output signal of an auxiliary cell array decoder 54, and each word line WL0 to WLn of the main cell array 52 is selected by an output signal of a X-decoder 51.

At the time of read-out operation, if one of the memory cells C1 to Cn of the main cell array 52 is selected by the output signals of the X-decoder 51 and a Y-decoder(not shown) and one of the memory cells D1 to Dn of the auxiliary cell array 53 is selected by the output signals of the auxiliary cell array decoder 54, the sense amplifier circuit is enabled. Then the source voltage Vcc is supplied to the sense amplifier circuit so that a current path through the load resistor R1 and the reference cell $C_{REF}$ is formed.

For example, if it is assumed that the memory cell C1 is selected from the main cell array 52, the memory cell Dn of the auxiliary cell array 53 is selected. That is, since the selected memory cell C1 of the main cell array 52 is positioned near to the contact hole A, the memory cell Dn positioned far from the contact hole B is selected from the auxiliary cell array 53. In addition, if it is assumed that the memory cell Cn is selected from the main cell array 52, the memory cell D1 of the auxiliary cell array 53 is selected. That is, since the selected memory cell Cn of the main cell array 52 is positioned far from the contact hole A, the memory cell D1 positioned near to the contact hole B is selected from the auxiliary cell array 53.

Therefore, regardless of the position of contact hole A and regardless of which memory cell is selected, the resistance value of the common source line Sc of the main cell array 52 is maintained constantly. Therefore the ratio of currents flowing through the nodes K1 and K2 depends only on the condition of the reference cell $C_{REF}$ and the selected memory cell regardless of the resistance value of the common source line Sc.

That is, the sense amplifier 55 compares the voltage $V_1$ applied according to the amount of current flowing through the reference cell $C_{REF}$ and the voltage $V_2$ applied according to the amount of current flowing through the selected memory cell, and decides that data of "1" is stored, that is, the selected memory cell is a programmed cell, in case the voltage $V_1$ is higher than the voltage $V_2$, and that data of "0" is stored, that is, the selected memory cell is an erased cell, in case the voltage $V_1$ is lower than the voltage $V_2$, and accordingly outputs data through the output terminal OUT.

In case of using the present invention, since the memory cells D1 to Dn of the auxiliary cell arrays 44 and 53 are arranged only in longitudinal direction, only one auxiliary cell array decoder 45 and 54 is required to select the memory cells D1 and Dn. In addition, since it is sufficient to connect the auxiliary cell arrays 44 and 53 of only a half of the number of the memory cells existing between two adjacent contact holes (That is, from one contact hole A to other contact hole A) of the main cell array 42 and 52, the increase in the size of flash memory device is neglectable.

As described above, according to the present invention, the resistance value of the common source line is always maintained constantly by connecting the auxiliary cell array to the input terminal of the sense amplifier so that the variation in cell current according to the change of the position of source contact at the time of read-out operation is prevented. Therefore, precise read-out operation of data stored in memory cell is made possible, and the reliability of the device is improved by the uniform read-out operation.

The foregoing description, although described in its perferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A sense amplifier circuit for reading-out information stored in a memory cell, included in a flash memory device having a main cell array in which a plurality of memory cells are connected between a plurality of word lines and at least one bit line, the memory cells also connecting to a common source line of the memory cell array, the sense amplifier circuit comprising:

an auxiliary cell array in which a plurality of memory cells are connected between a plurality of word lines and a bit line;

a reference cell connected between a source voltage and ground and in which a drain thereof is connected to a common source line of said auxiliary cell array;

a sense amplifier having first and second input terminals connected to said common source line of said auxiliary cell array and said at least one bit line of said main cell array, respectively, and an auxiliary cell array decoder configured to select a memory cell in the auxiliary cell array depending on a position of a source contact of a corresponding memory cell selected in the main memory cell array, such that a first resistance value of the common source line of the main cell array and a second resistance value of the common source line of the auxiliary cell array are maintained substantially similar to one another, regardless of which cell within the main cell array is selected.

2. A sense amplifier circuit for reading-out information stored in a memory cell, included in a flash memory device having a main cell array in which a plurality of memory cells are connected between a plurality of word lines and at least one bit line, the memory cells also connecting to a common source line of the memory cell array, the sense amplifier circuit comprising:

an auxiliary cell array in which a plurality of memory cells are connected between a plurality of word lines and a bit line;

a reference cell connected between a source voltage and ground;

a sense amplifier having a first input terminal connected to a common source line of said auxiliary cell array and also to said at least one bit line of said main cell array, and a second input terminal connected to a drain of said reference memory cell; and an auxiliary cell array decoder configured to select a memory cell in the auxiliary cell array depending on a position of a source contact of a corresponding memory cell selected in the main memory cell array, such that a resistance value of the common source line of the main cell array is substantially the same, regardless of which cell within the main cell array is selected.

3. A sense amplifier circuit comprising a sense amplifier for reading-out information stored in main memory cells of a main memory cell array by comparing a first voltage created by a reference cell with a second voltage created by said main memory cells, the sense amplifier further comprising:

an auxiliary cell array connected across said reference cell, said auxiliary cell array having a plurality of memory cells which are connected in parallel with each other and are selected by an auxiliary cell array decoder according to a position of a source contact of a corresponding cell in said main memory cell array.

4. A sense amplifier circuit comprising a sense amplifier for reading-out information stored in main memory cells of a main memory cell array by comparing a first voltage created by a reference cell with a second voltage created by said main memory cells, the sense amplifier further comprising:

an auxiliary cell array connected across said main memory cells, said auxiliary cell array having a plurality of memory cells which are connected in parallel with each other and are selected by an auxiliary cell array decoder according to a position of source contact of a corresponding cell in said main memory cell array.

* * * * *